United States Patent
Park et al.

(10) Patent No.: US 9,030,004 B2
(45) Date of Patent: May 12, 2015

(54) STACKED SEMICONDUCTOR APPARATUS, SYSTEM AND METHOD OF FABRICATION

(71) Applicants: Ki-Tae Park, Seongnam-si (KR); Kang-Wook Lee, Suwon-si (KR); Young-Don Choi, Seoul (KR); Yun-Sang Lee, Yongin-si (KR)

(72) Inventors: Ki-Tae Park, Seongnam-si (KR); Kang-Wook Lee, Suwon-si (KR); Young-Don Choi, Seoul (KR); Yun-Sang Lee, Yongin-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 156 days.

(21) Appl. No.: 13/659,146

(22) Filed: Oct. 24, 2012

(65) Prior Publication Data
US 2013/0077374 A1 Mar. 28, 2013

Related U.S. Application Data

(63) Continuation of application No. 12/352,735, filed on Jan. 13, 2009, now abandoned.

(30) Foreign Application Priority Data

Jan. 15, 2008 (KR) .................. 10-2008-0004351

(51) Int. Cl.
*H01L 23/538* (2006.01)
*H01L 23/34* (2006.01)
*H01L 23/64* (2006.01)
(Continued)

(52) U.S. Cl.
CPC ............ *H01L 23/5384* (2013.01); *H01L 23/64* (2013.01); *H01L 25/0657* (2013.01); *H01L 2225/06513* (2013.01); *H01L 2225/06541* (2013.01); *H01L 2225/06562* (2013.01); *H01L 2225/06589* (2013.01); *H01L 2924/09701* (2013.01); *H01L 2924/19106* (2013.01); *G11C 5/06* (2013.01); *H01L 23/34* (2013.01); *H01L 2224/16* (2013.01)

(58) Field of Classification Search
CPC ................. H01L 25/0657; H01L 2224/16145; H01L 2224/81; H01L 2225/06541; H01L 2225/06513; H01L 24/17
USPC ............ 257/713, 777, 686, E25.013, E23.08
See application file for complete search history.

(56) References Cited

U.S. PATENT DOCUMENTS 6,300,792 B1 10/2001 Pedersen
6,323,680 B1 11/2001 Pedersen et al.
(Continued)

FOREIGN PATENT DOCUMENTS

JP 2001168491 A 6/2001
JP 2002538634 12/2002
(Continued)

OTHER PUBLICATIONS

Korean Office Action Issued in Corresponding Korean Patent Application No. 10-2008-0004351 Issued Nov. 29, 2013.

*Primary Examiner* — Cathy N Lam
(74) *Attorney, Agent, or Firm* — Volentine & Whitt, PLLC

(57) ABSTRACT

A stacked semiconductor apparatus and method of fabricating same are disclosed. The apparatus includes upper and lower semiconductor devices having a similar pattern of connection elements. When stacked connected the resulting plurality of semiconductor devices includes a serial connection path traversing the stack, and may also include parallel connection paths, back-side mounted large components, and vertical thermal conduits.

11 Claims, 12 Drawing Sheets

(51) Int. Cl.
*H01L 25/065* (2006.01)
*G11C 5/06* (2006.01)

(56) References Cited

U.S. PATENT DOCUMENTS

| | | | |
|---|---|---|---|
| 6,342,792 B1 | 1/2002 | Huang et al. | |
| 6,359,468 B1 | 3/2002 | Park et al. | |
| 6,366,120 B1 | 4/2002 | Schleicher et al. | |
| 6,407,576 B1 | 6/2002 | Ngai et al. | |
| 6,448,661 B1 * | 9/2002 | Kim et al. | 257/777 |
| 6,480,027 B1 | 11/2002 | Ngai et al. | |
| 6,525,564 B2 | 2/2003 | Schleicher et al. | |
| 6,614,261 B2 | 9/2003 | Ngai et al. | |
| 6,690,195 B1 | 2/2004 | Ngai et al. | |
| 6,727,727 B2 | 4/2004 | Schleicher et al. | |
| 6,798,049 B1 | 9/2004 | Shin et al. | |
| 6,894,533 B2 | 5/2005 | Ngai et al. | |
| 6,897,680 B2 | 5/2005 | Schleicher et al. | |
| 6,982,488 B2 | 1/2006 | Shin et al. | |
| 6,989,689 B2 | 1/2006 | Ngai et al. | |
| 7,123,052 B2 | 10/2006 | Schleicher et al. | |
| 7,211,900 B2 | 5/2007 | Shin et al | |
| 7,262,635 B2 | 8/2007 | Schleicher et al. | |
| 7,317,332 B2 | 1/2008 | Ngai et al. | |
| 7,492,188 B2 | 2/2009 | Ngai et al. | |
| 7,839,167 B2 | 11/2010 | Ngai et al. | |
| 2004/0196635 A1 | 10/2004 | Park et al. | |
| 2007/0085198 A1 | 4/2007 | Shi et al. | |
| 2008/0054489 A1 | 3/2008 | Farrar et al. | |

FOREIGN PATENT DOCUMENTS

| | | |
|---|---|---|
| JP | 2004152811 A | 5/2004 |
| JP | 2005026445 A | 1/2005 |
| JP | 2005167093 A | 6/2005 |
| KR | 1020010058584 | 7/2001 |
| KR | 1020020066095 A | 8/2002 |
| KR | 1020030012238 A | 2/2003 |
| KR | 1020050054479 A | 6/2005 |
| WO | WO0052826 | 9/2000 |

* cited by examiner

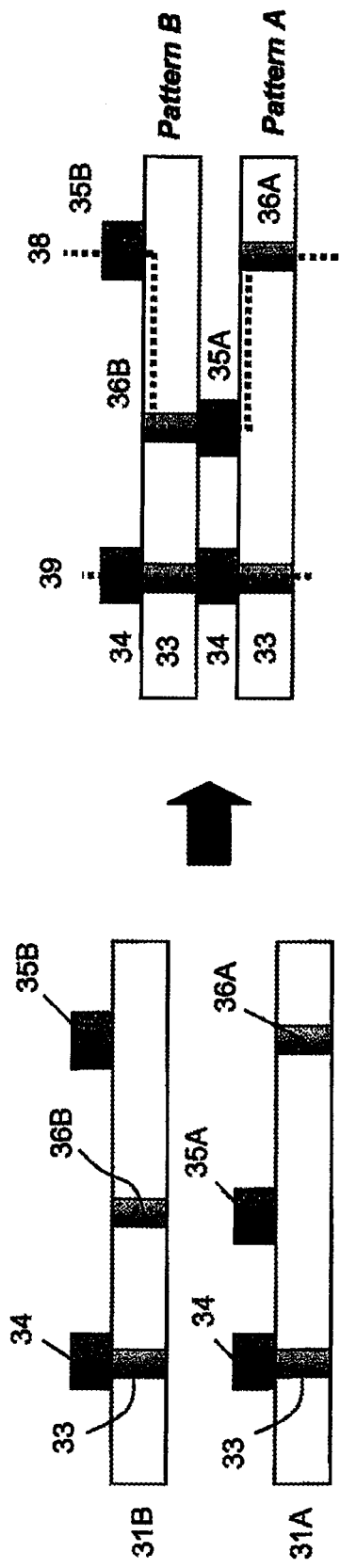
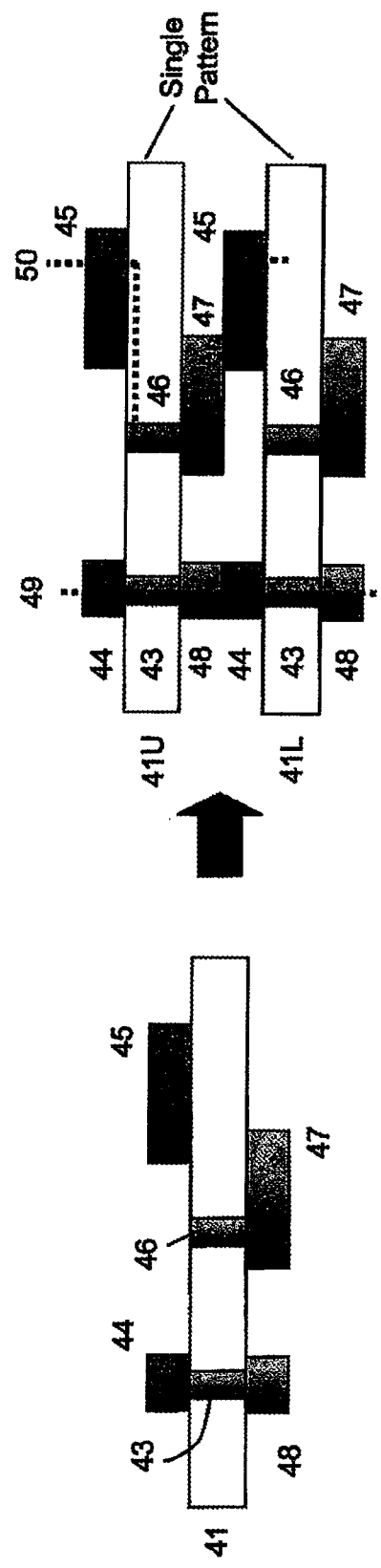
FIG. 3 (Prior Art)
FIG. 4

STACKED SEMICONDUCTOR APPARATUS, SYSTEM AND METHOD OF FABRICATION

CROSS-REFERENCE TO RELATED PATENT APPLICATION

This application is a Continuation Application of Application No. 12/352,735, filed Jan. 13, 2009 and now abandoned, and which claims the benefit of Korean Patent Application No. 10-2008-0004351 filed Jan. 15, 2008, the subject matter of which is hereby incorporated by reference.

SUMMARY

In one embodiment, the invention provides an apparatus including; a stacked plurality of semiconductor devices, each device comprising a circuit element disposed on a front-side of a substrate, a back-side connection element disposed on a back-side of the substrate, and a similar connection pattern of connection elements, and a serial connection path connecting circuit elements respectively disposed on an upper device and a lower device in the stacked plurality of semiconductor devices, the serial connection path comprising a first inter-device connection element disposed on the front-side of the lower device, a first back-side connection element disposed on the back-side of the upper device, and a first vertical connection element extending through the substrate of the upper device, wherein respective connection elements in the connection pattern of each device comprises at least the first inter-device connection element, the first back-side connection element, and the first vertical connection element are vertically aligned through the stacked plurality of semiconductor devices.

In another embodiment, the invention provides a method of fabricating an apparatus that includes forming upper and lower semiconductor devices with a similar pattern of connection elements, wherein each one of the upper and lower devices comprises a circuit element, a first vertical connection element, a first inter-device connection element, and a first back-side inter-device connection element, and stack connecting the upper device on the lower device, such that the first inter-device connection element, the first back-side connection element, and the first vertical connection element of the upper device are respectively, vertically aligned with the first inter-device connection element, the first back-side connection element, and the first vertical connection element of the lower device, such that a serial connection path is formed connecting the circuit element on the lower device to the circuit element on the upper device through at least the first inter-device connection element disposed on a front-side of the lower device, the first back-side connection element disposed on a back-side of the upper device, and the first vertical connection element extending through a substrate of the upper device.

In another embodiment, the invention provides a method of fabricating a stacked semiconductor apparatus that includes; fabricating a plurality of semiconductor devices each comprising a circuit element and a similar connection pattern, wherein the similar connection pattern comprises a plurality of vertical connection elements, a plurality of front-side inter-device connection elements, and a plurality of back-side inter-device elements, stack connecting the plurality of semiconductor devices to form a plurality of internal connection paths vertically traversing the stack connected plurality of semiconductor devices, wherein the plurality of internal connection paths comprises a serial connection path communicating a serial signal to respective circuit elements disposed on each one of the stacked connection plurality of semiconductor devices, and a parallel connection path communicating a parallel signal to circuit elements disposed on each one of the stacked connection plurality of semiconductor devices.

In another embodiment, the invention provides an apparatus that includes a stacked plurality of semiconductor devices, each device comprising a circuit element configured from circuit components and disposed on a front-side of a substrate, a large component disposed on a back-side of the substrate, wherein the large component is fabricated with a size at least an order of magnitude greater than a size of the circuit components, and a similar pattern of connection elements, wherein at least one internal connection path connects circuit elements respectively disposed on an upper device and a lower device in the stacked plurality of semiconductor devices, the connection path comprising a first inter-device connection element disposed on the front-side of the lower device, a first back-side connection element disposed on the back-side of the upper device, and a first vertical connection element extending through the substrate of the upper device, and wherein respective connection elements in the pattern of connection elements including at least the first inter-device connection element, the first back-side connection element, and the first vertical connection element are vertically aligned through the stacked plurality of semiconductor devices.

In another embodiment, the invention provides a method of fabricating an apparatus that includes; forming upper and lower semiconductor devices with a similar connection pattern, wherein each one of the upper and lower devices comprises a circuit element configured from circuit components and disposed on a front-side of a substrate, a large component disposed on a back-side of the substrate, and a plurality of connection elements in the similar connection pattern comprises a first vertical connection element, a first inter-device connection element, and a first back-side inter-device connection element, and stack connecting the upper device on top of the lower device, such that at least one connection path connects circuit elements respectively disposed on the upper and lower devices, wherein the at least one connection path comprises the first inter-device connection element disposed on the lower device, the first back-side inter-device connection element disposed on the upper device, and the first vertical connection element extending through the upper device, wherein respective connection elements in the similar connection pattern of the lower and upper devices including at least the first inter-device connection element, the first back-side connection element, and the first vertical connection element are vertically aligned through the stacked plurality of semiconductor devices.

In another embodiment, the invention provides an apparatus that includes; a stacked plurality of semiconductor devices disposed on a mounting substrate, each device in the stacked plurality of semiconductor devices comprising a circuit element, at least one vertical thermal conduit traversing the stacked plurality of semiconductor devices and thermally coupling circuit elements respectively disposed on an upper device and a lower device in the stacked plurality of semiconductor devices, the vertical thermal conduit including, a first vertical connection element extending through the upper device, a second vertical connection element extending through the lower device, wherein the first and second vertical connection elements are vertically aligned in the stacked plurality of semiconductor devices, and a thermal inter-device connection element disposed on the back-side of the upper device, and a heat sink element disposed on the mounting substrate and thermally coupled to the at least one vertical thermal conduit.

BRIEF DESCRIPTION OF THE DRAWINGS

FIG. 3 illustrates the implementation of a conventional serial connection path through a stacked semiconductor apparatus.

FIG. 4 illustrates the implementation of a serial connection path through a stacked semiconductor apparatus according to an embodiment of the invention.

DESCRIPTION OF EMBODIMENTS

The development of modern semiconductors, and semiconductor memories in particular, is one characterized by continuing efforts to simultaneously improve overall performance while reducing production costs. Such efforts have resulted in dramatic reductions in the size of individual components forming the constituent integrated circuits of semiconductors. Decreased component size and improved fabrication techniques have yielded contemporary semiconductors having much greater integration density.

At least in the context of semiconductor memories, greater integration density translates into improved performance (e.g., greater data bandwidth per unit area of substrate occupied by the memory). Improved performance with a decreased "footprint" (i.e., the surface area occupied by a semiconductor) is a desirable quality, since surface area on a mounting substrate, such as a printed circuit board (PCB), is an increasingly coveted resource in contemporary electronics, particularly in portable electronics.

Thus, the demand for smaller and smaller devices providing greater data bandwidth and/or increased computational capabilities has motivated designers to vertically integrate semiconductors. "Vertical integration" is a geometrically relative term that assumes a principal "horizontal" plane defined by the substrate mounting a vertically integrated semiconductor. That is, recognizing limitations to the availability of substrate surface area, designers have stacked one semiconductor device on top of another to implement stacked semiconductor apparatuses. For example, semiconductor memories are often vertically stacked and functionally ganged to provide greater data storage capabilities and/or greater data access bandwidth per unit surface area of substrate.

Historically, individual semiconductor devices in a stacked apparatus are accessed using signal paths largely implemented by connection elements disposed on the periphery of the stack. That is, control signals, data signals and/or address signals have principally been communicated to semiconductor devices via connection elements running up the sides of the stack. More recently, however, through silicon vias (TSVs) and associated vertical connection elements have been used to implement connection paths "internal" to the stack, (i.e., signal connection paths that do not expand the footprint of the stacked semiconductor apparatus on a mounting substrate).

Figure 1:
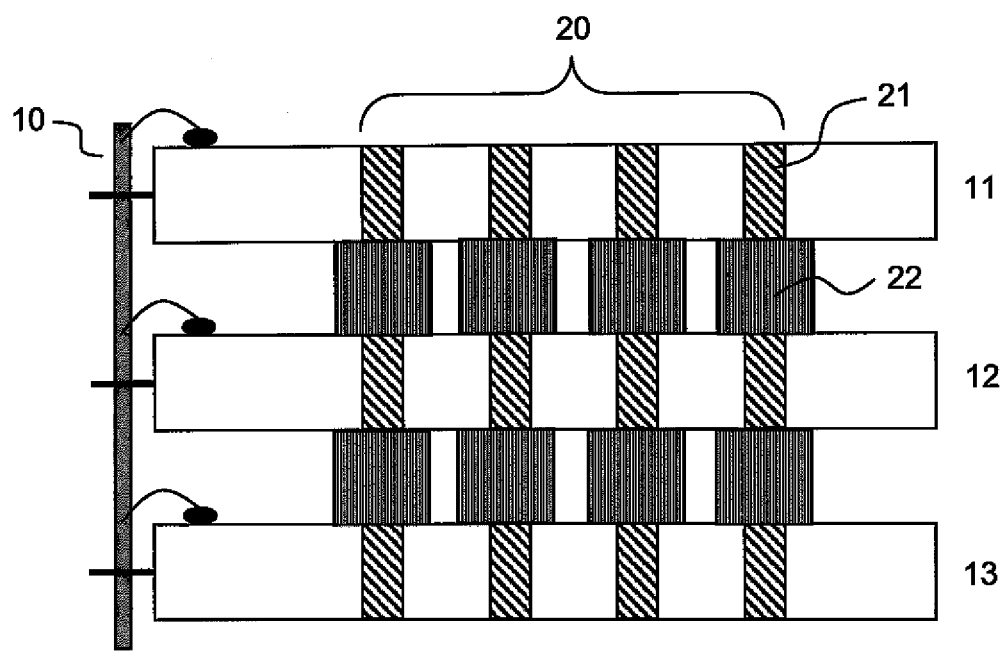
FIG. 1 illustrates conventionally implemented connection paths (internal and external) through a stacked semiconductor apparatus.

Figure (FIG.) 1 illustrates differences between an external connection path 10 disposed on the edge of a stacked plurality of semiconductor devices 11, 12 and 13, and a plurality of internal connection paths 20 extending upward through the stack. As may be seen from FIG. 1, external connection path 10 expands the footprint of the stacked apparatus, otherwise defined by the size of the semiconductor devices in the stack. Further, the very fine wiring and attachment mechanisms used to implement external connection path 10 are subject to mechanical impact and are more exposed to potentially adverse environmental conditions. In contrast, internal connection paths 20 are better protected within the stack and do not expand the footprint of the stacked apparatus.

Indeed, internal connection paths 20 have been used to good effect in the implementation of multiple parallel signal paths. That is, each semiconductor device 11, 12, and 13 may be fabricated with similarly laid out TSVs 21 and then stacked using intervening inter-device connection elements 22 to form multiple, vertical-running, internal connection paths 20. Multiple parallel connection paths, whether implemented by external connection paths and/or internal connection path, are very useful in the functional operation of stacked semiconductor apparatuses. This is particularly true for stacked semiconductor memory devices which often require data buses implemented with multiple parallel signal lines.

Figure 2A:
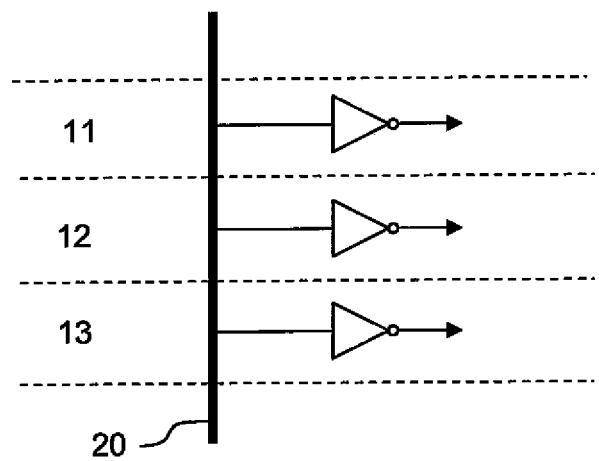
FIGS. 2A and 2B illustrate parallel verses serial connection paths through a stacked semiconductor apparatus.

Consider the operation of the stacked semiconductor device shown in FIG. 1. Assume each one of semiconductor device 11, 12 and 13 is a semiconductor memory device necessarily receiving command/control, address, and/or data (C/A/D) signals, and providing data signals to an external circuit (not shown). As further illustrated in FIG. 2A, each internal connection path 20 may be used to communicate C/A/D signals in parallel to memory devices 11, 12 and 13. (Additionally or alternately, each internal connection path 20 may be used to communicate data from one or more of memory devices 11, 12 and 13 to the external circuit). For example, multiple internal connection paths may be used to implement multi-lane bus communicating C/A/D signals in parallel to memory devices 11, 12 and 13.

Figure 2B:
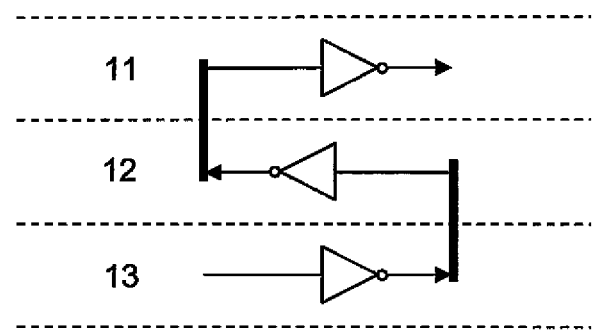

However, while many signals communicated to/from the devices in a stacked semiconductor apparatus are parallel in nature, there are other commonly used signals that are serial in nature. Serial signals include as examples, device select signals, device identification signals, test signals, and special function enable signals. In contrast to the parallel connection path shown in FIG. 2A, FIG. 2B conceptually illustrates the implementation of a serial connection path through a stacked semiconductor apparatus.

Unfortunately, conventional stacked semiconductor devices are not able to implement serial connection paths with the same economy as parallel connection paths. Serial connection paths have historically required different connection element layouts for different (e.g., alternate) devices in a stack of devices. That is, in order to implement a serial connection path through the stacked plurality of devices, device 12 in the example of FIG. 1 will typically have a different connection pattern from that of device 11 and/or device 13. This "multiple layout" requirement complicates the assembly and inventory of the semiconductor devices ultimately arranged in a stack, and drives up the overall cost of fabricating a stacked semiconductor apparatus.

Conventional stacked semiconductor apparatuses are also challenged by the incorporation of certain "large components" such as heat sinks, and large capacitive, inductive and resistive elements. Large components are necessarily implemented with a radically different scale as compared with the other components forming the circuit elements of the individual semiconductor devices in a stacked apparatus. Unfortunately, as complete systems or sub-systems are increasingly implemented using stacked arrangements of semiconductor devices, such stacked arrangements must accommodate the incorporation of large components. This has proved difficult in practice, and commonly used fabrication techniques largely disposed such large components "off-stack" (i.e., on the mounting substrate), thereby consuming additional substrate surface area. Alternately, a specialized and additional stack layer must be provided to accommodate large components, thereby complicating the overall design and fabrication of the stacked apparatus.

The present invention relates generally to stacked semiconductor apparatuses, related systems and methods of fabrication, where the stacked semiconductor apparatuses incorporate internal connection paths implemented with vertical connection elements, such as through silicon vias (TSVs).

Embodiments of the present invention will now be described more fully with reference to the accompanying drawings. The teachings associated with the illustrated embodiments of the invention that follow, while drawn to specific illustrated examples, are widely applicable to a broad range of semiconductor apparatuses, systems incorporating such semiconductor apparatuses, and related methods of fabrication. Thus, the scope of the invention is not limited to only the illustrated embodiments. For example, certain illustrated examples are drawn to apparatuses comprising stacked memory devices, but the invention is not limited to only this type of device. Other device types, such as computational logic devices, analog signal processing devices, etc., may be combined in a stacked semiconductor apparatus according to various embodiments of the invention.

In the context of stacked apparatuses comprising one or more semiconductor memory devices, both volatile and non-volatile memory devices are contemplated by embodiments of the invention. In certain embodiments of the invention, both volatile and non-volatile memory devices may be mixed within a stacked plurality of memory devices. In other embodiments of the invention, volatile and non-volatile memory devices, as well as a related computational logic device(s) or signal processing device(s) may be mixed within a stacked plurality of devices to form a system or sub-system. For example, a memory controller may be stacked with a plurality of memory devices to form a memory sub-system in certain embodiments of the invention.

Embodiments of the invention are drawn to apparatuses comprising a stacked plurality of semiconductor devices, wherein individual devices incorporate vertical connection elements, such as various forms of TSVs. The particular fabrication techniques used to form the TSVs are deemed conventional and will vary with device type and/or the overall design of the stacked semiconductor apparatus. Further, some embodiments of the invention may benefit from the incorporation of one or more external connection paths, as variously formed in conventional manner.

The foregoing having been said and bearing in mind that the embodiments that follow are drawn to semiconductor devices comprising TSVs, the present invention is not limited to only TSVs as vertical connection elements. Rather, TSVs are used as a convenient example of a broad class of vertical connection elements that generally allow an electrical signal to pass through a device substrate rather than traversing outside the outer edge of the device substrate.

As noted above, one problem commonly associated with conventional stacked apparatuses is the economical provision of a serial connection path between the circuit elements of different semiconductor devices in a stacked semiconductor apparatus. The term "circuit element" is used to generally denote any element (active or passive) or any collection of elements forming an integrated circuit (e.g., a memory or logic circuit) reasonably formed on a principal surface of a semiconductor device. For ease of description, the two opposing principal surfaces of a device substrate will be referred to as "front-side" and "back-side", respectively.

FIGS. 3 and 4 are presented as comparative examples between a conventional serial connection path implementation (FIG. 3), and a serial connection path implementation in accordance with an embodiment of the invention (FIG. 4). In FIG. 3, lower device 31A and upper device 31B are fabricated with different connection patterns. A "connection pattern" is an arrangement of connection elements designed to implement a vertical connection path (parallel or serial) through the stacked semiconductor apparatus. Thus, connection patterns "A" and "B" for device 31A and 31B, respectively, include TSVs 33 and 36, and inter-device connection elements 34 and 35. However, the pattern (or layout positions) of TSV 36 and inter-device connection element 35 within the respective connections patterns A and B implementing a serial connection path 38 are different—meaning laid out in a vertically non-aligned relationship as between lower and upper stacked devices 31A and 31B.

In contrast, the connection elements, TSV 33 and inter-device connection element 34, used to implement a parallel connection path 39 through devices 31A and 31B have a "similar pattern". That is, the respective connection elements in patterns A and B used to implement parallel connection path 39 are vertically aligned through the stacked plurality of semiconductor devices.

As noted above, the different connection patterns A and B required to conventionally implement serial connection path 38 result in different devices that must be arranged according to their respective connection patterns within the stacked plurality of devices. Thus, inventory and fabrication assembly must account for pattern A-type and pattern B-type devices, despite the fact that device 31A and 31B may otherwise be identical in form, function, and layout (i.e., otherwise identical semiconductor memory devices). U.S. Pat. No. 7,123,497 is one example of a conventional stacked semiconductor apparatus comprising devices having different connection patterns used to implement a serial connection path. The subject matter of this patent is hereby incorporated by reference.

In contrast and as illustrated in FIG. 4, a stacked apparatus according to an embodiment of the invention may be implemented using devices having a "similar connection pattern", where respective connection elements in the connection pattern for each device are vertically aligned throughout the stacked plurality of devices. Device 41 comprises a connection pattern including inter-device connection elements 44, back-side connection element 48, and vertical connection element 43 implementing a portion of a parallel connection path 49 through the stacked plurality of devices. The connection pattern of device 41 also includes inter-device connection element 45, back-side connection element 47, and vertical connection element 46 implementing a portion of a serial connection path 50 through the stacked apparatus.

Vertical connection elements 43 and 46 may be TSVs. Inter-device connection elements 44, 45, 47, and 48 may be conventionally implemented in a variety of forms, (e.g., metal bumps, ball/pad structures, etc.), such as those commonly used in conventional surface mount or device stacking technologies. Inter-device connection elements and back-side connection elements may be similarly implemented, and a different name is used herein merely to designate a subset of inter-device interconnection elements disposed on the back-side of a device substrate.

Some or all of the inter-device connection elements provided in a stacked apparatus according to an embodiment of the invention may be used to "stack connect" an upper device with a lower device. That is, in addition to providing an electrical link in a connection path traversing the stacked plurality of devices, an inter-device connection element may serve as part of the structural support and/or mechanical assembly connecting stack-adjacent devices. This additional stack connect functionality is optional to an inter-device connection element, but where present will be defined by the size and placement of the inter-device connection element, as well as the overall design of the stacked apparatus.

Inter-device connection elements 47 and 48 in device 41 of FIG. 4 are "back-side connection elements". Embodiments of the invention make use of conventionally understood back-side fabrication processes to effectively provide back-side inter-device connection elements, and (optionally) back-side distribution lines, back-side circuit elements, and/or back-side mounted large components. Other embodiments presented hereafter will discuss in some additional detail these fabrication options for a stacked semiconductor apparatus.

In a stacked configuration of upper device 41U and lower device 41L shown in FIG. 4, inter-device connection element 44 connected to vertical connection element 43 of lower device 41L contacts back-side connection element 48 connected to vertical connection element 43 of upper device 41U to form a portion of parallel connection path 49 through the stacked plurality of devices.

One portion of serial connection path 50 runs through inter-device connection element 45 on lower device 41L, back-side connection element 47 and vertical connection element 46 of upper device 41U. Assuming that inter-device connection element 45 is electrically connected to a circuit element disposed on the front-side of lower device 41L, and that vertical connection element 46 is electrically connected to a circuit element disposed on the front-side of upper device 41U, serial connection path 50 may be used to communicate a serial signal between these respective circuit elements.

FIG. 5, collectively related drawings of FIGS. 5A through 5F, further illustrates the connection of a lower-device-resident circuit element and an upper-device-resident circuit element using a serial connection path implemented according to an embodiment of the invention. FIG. 5 also illustrates a method of fabricating a stacked semiconductor apparatus according to an embodiment of the invention.

Figure 5D:
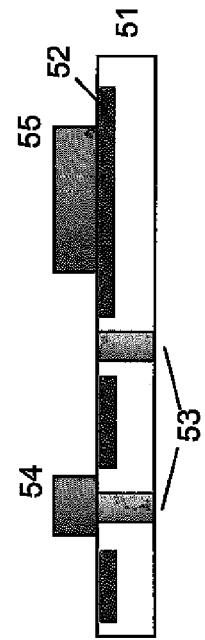
FIGS. 5A, 5B, 5C, 5D, 5E and 5F illustrate an exemplary method of fabricating the serial connection path of FIG. 4.
Figure 5E:
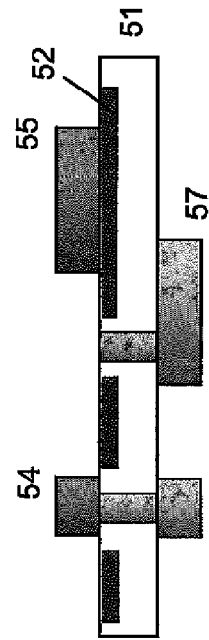
Figure 5F:
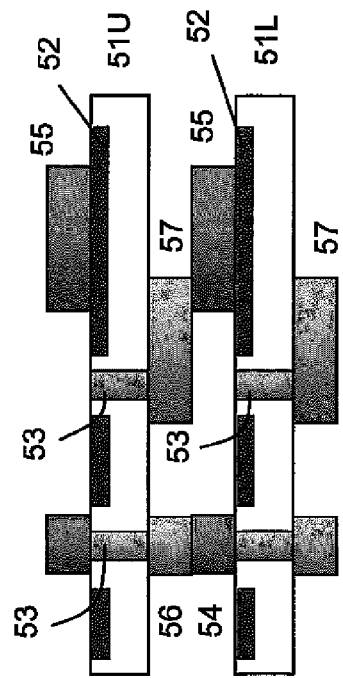
Figure 5A:
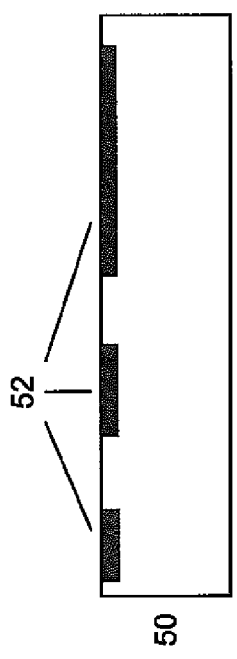

In FIG. 5A, a device to be arranged in the stacked semiconductor apparatus is implemented on a preliminary substrate 50 using well understood fabrication processes to form one or more circuit elements 52 on the front-side of preliminary substrate 50. Preliminary substrate 50 may take one of many different conventional forms including, for example, semi-conducting, semi-insulating, silicon, silicon-on-insulator, germanium, silicon-germanium, glass, ceramic, or a combination of same. Circuit elements 52 fabricated on the front-side of preliminary substrate 50 are assumed to include one or more components operating according to well understood semiconductor properties and/or principals. Hence, the term "semiconductor device" is used in the current description to generally refer to a broad class of microelectronic devices, regardless of the actual materials forming their constituent substrate.

Figure 5B:
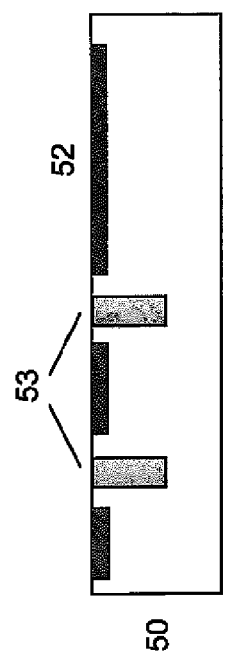
Figure 5C:
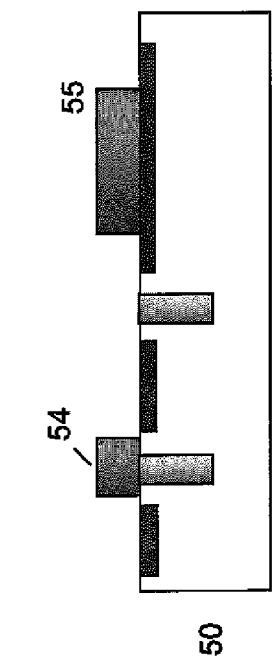

As illustrated in FIG. 5B, vertical connection elements 53 (e.g., TSVs) are formed at defined locations in the front-side of preliminary substrate 50. Vertical connection elements 53 may be formed using conventional photolithography and etching processes. See, for example, U.S. Pat. Nos. 6,973,054 and 7,045,870, and published U.S. Patent Application 2007/0054419, the collective subject matter of which is hereby incorporated by reference. In FIG. 5B, TSVs are formed from the front-side down towards the back-side of preliminary substrate 50. However, this need not always be the case. Certain back-side TSV formation processes may be additionally or alternately used. See, for example, commonly assigned U.S. patent application Ser. No. 12/045,840 filed Mar. 11, 2008, the subject matter of which is hereby incorporated by reference.

However, in the working example of FIG. 5, front-side inter-device connection elements 54 and 55 are formed on preliminary substrate 50 after a plurality of TSVs 53 has been formed. In the illustrated example, inter-device connection element 54 is electrically connected with a corresponding TSV 53 to form a portion of an parallel connection path. In contrast, inter-device connection element 55 is electrically connected with circuit element 52 formed on the front-side of preliminary substrate 50 and is later used to implement a serial connection path.

As shown in FIG. 5D, after the formation of inter-device connection elements 54 and 55 on the front-side of preliminary substrate 50, preliminary substrate 50 is thinned by applying conventional processing techniques, (e.g., chemical-mechanical polishing or CMP) to the back-side of preliminary substrate 50 to form a finished substrate 51. Alternately, preliminary substrate 50 may be thinned before the formation of front-side interconnection elements 54 and 55. The thinner vertical profile of substrate 51 exposes the bottom conductive surfaces of the plurality of TSVs 53.

As shown in FIG. 5E, back-side inter-device connection elements 56 and 57 are next formed in electrical connection with the exposed bottom conductive surfaces of respective TSVs 53. In FIG. 5E, inter-device connection element 56 is associated with the parallel connection path portion formed by one of the TSVs 53 and inter-device connection element 54. Inter-device connection element 57 is electrically connected to another TSV 53, which in turn is electrically connected to circuit element 52 (e.g., via a front-side distribution line, not shown). In this manner, back-side inter-device connection element 57, TSV 53, circuit element 52 (and optionally associated distribution line(s)), and front-side inter-device connection element 55 form a portion of the serial connection path.

In FIG. 5F, an upper device 51U and a lower device 51L, having similar connection patterns (i.e., arrangements of similarly laid out connection elements) are stacked connected within a semiconductor apparatus. Only two stacked devices are shown in FIG. 5F, but those of ordinary skill in the art will recognize that any two adjacent devices in a stacked arrangement of devices may be arbitrarily designated as upper and lower devices, regardless of the actual number of devices forming the stacked semiconductor apparatus.

In FIG. 5F, a portion of a parallel connection path through the stacked apparatus is formed by the connection of back-side inter-device connection element 56 on the upper device 51U with the front-side inter-device connection element 54 of lower device 51L. A portion of a serial connection through the stacked apparatus is formed by the connection of back-side inter-device connection element 57 on upper device 51U with the front-side inter-device connection element 55 of lower device 51L.

Thus, the resulting parallel connection path portion through the stacked apparatus of FIG. 5F is largely conventional in arrangement and provision. However, the serial connection path portion is provided without the requirement of using adjacent, stack connected devices with different connection patterns. As may be seen from FIG. 5, two stacked devices 51 U and 51 L might be flipped in their relative position in the stack, without altering the arrangement and provision of the serial connection path. Thus, it is no longer necessary to identify, for example, pattern A-type verses pattern B-type devices in inventory or during final assembly of the stacked semiconductor apparatus. Further, the similar nature of the connection patterns for each device in the stacked apparatus provides better immunity from stack connect mismatches (i.e., electrical connection failures caused by misalignment of inter-device connection elements of an upper and lower device).

The foregoing requirement for a similar connection pattern in adjacent devices of a stacked apparatus should not be understood as mandating a fully identical connection pattern for each device. Consider the embodiment shown in FIG. 6 in this regard.

Figure 6:
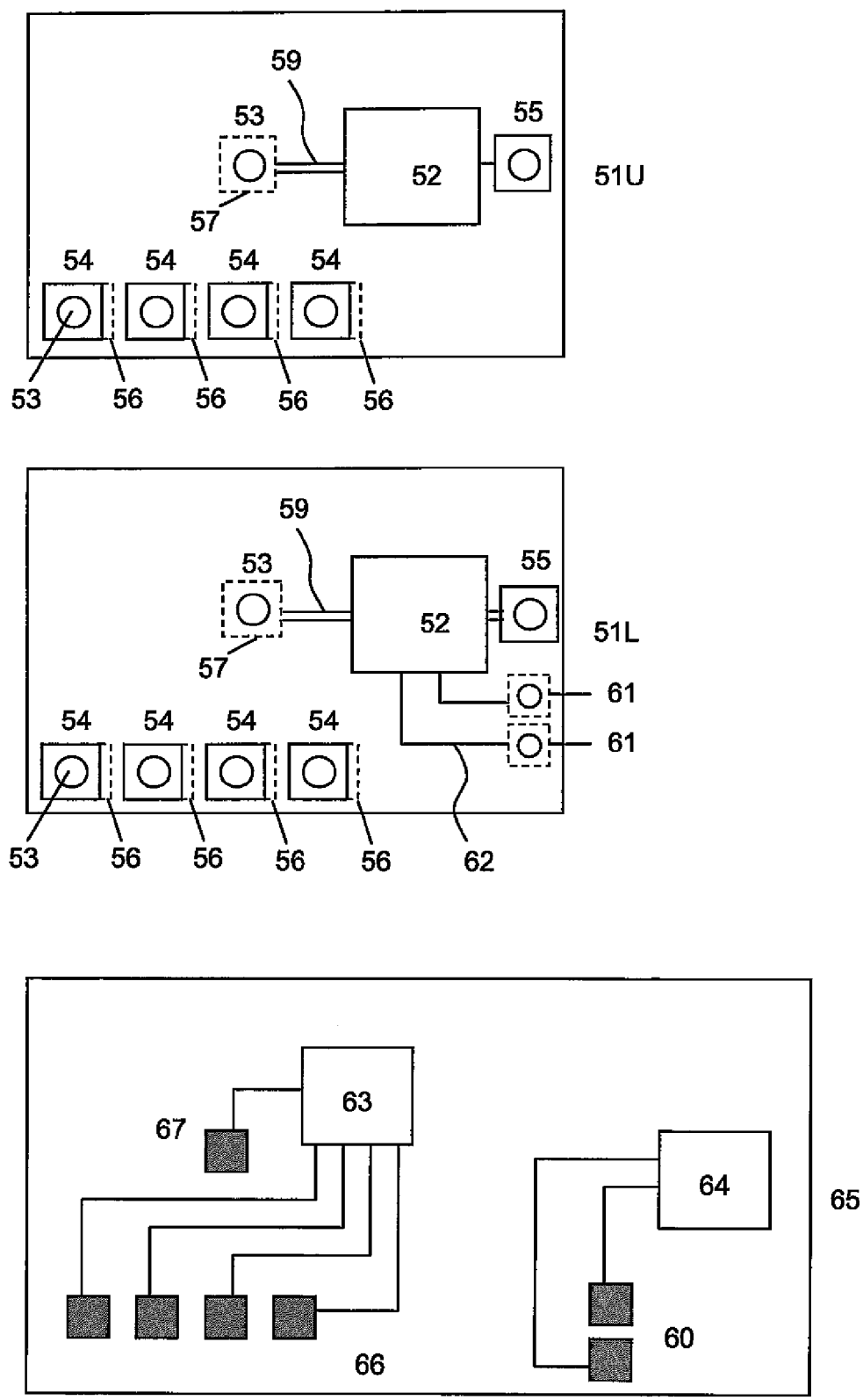
FIG. 6 illustrates the implementation of a serial connection path and related parallel connection paths through a stacked semiconductor apparatus according to an embodiment of the invention.

The stacked semiconductor apparatus of FIG. 6 is assumed to be a memory subsystem implemented by stacking a lower memory device 51L and an upper memory device 51U on a memory controller (or interface device) 65. The lower and upper memory devices 51L and 51U may be provided as fully or partially packaged semiconductor memory devices (e.g., SRAMs, DRAMs, or EEPROMs) or as unpackaged semiconductor memory dies.

Memory controller 65 comprises a first set of inter-device connection elements 66 used to implement a first (4-bit) parallel data bus and a second set of inter-device connection elements 60 used to implement a second (2-bit) parallel data bus. Circuit element 63 provides 4-bit wide parallel signaling (e.g., C/A/D signals) to inter-device connection elements 66. Circuit element 63 also provides a serial control signal (e.g., a chip select signal) to inter-device connection element 67. These two signals (one parallel and one serial) are communicated to both upper device 51U and lower device 51L. In contrast, circuit element 64 provides a separate 2-bit wide parallel signal (e.g., a test signal) to only circuit element 52 disposed on lower device 51 L.

In this example, the "similar connection pattern" for each of the upper device 51U and lower device 51L comprises front-side inter-device connection elements 54, each respectively associated with a vertical connection element 53 (TSV), and corresponding back-side inter-device connection elements 56 collectively forming portions of the 4-bit wide parallel data bus. Each similar connection pattern also includes back-side inter-device connection element 57, distribution line 59, a vertical connection element 53 (TSV) and front-side inter-device connection element 55.

In this exemplary configuration, the serial connection path extends in a zigzag pattern up through the stacked semiconductor devices 51U and 51L (i.e., up from element 67 to element 57, through vertical connection element 53 and then through distribution line 59 to first circuit element 52 of lower device 51L, then to element 55, and on to second circuit element 52 of the upper device 51U).

However, back-side inter-device connection elements 61 and front-side distribution lines 62 of lower device 51L are supplemental to the similar connection pattern provided by both lower device 51L and upper device 51U. Such additional connection element provision in one or more of the devices of a stacked semiconductor apparatus designed in accordance with an embodiment of the invention will not, however, affect the serial connection path implementation which is wholly enabled by the similar connection pattern existing between devices in the stacked apparatus. See again, FIG. 4.

As may be seen from the foregoing example, the similar connection pattern that characterizes the implementation of a serial connection path through a stacked plurality of devices makes necessary use of certain back-side inter-device connection elements. This type of back-side inter-device connection element may also be used with good effect to incorporate large components within a stacked plurality of devices with improved economy over conventional fabrication techniques.

Figure 7A:
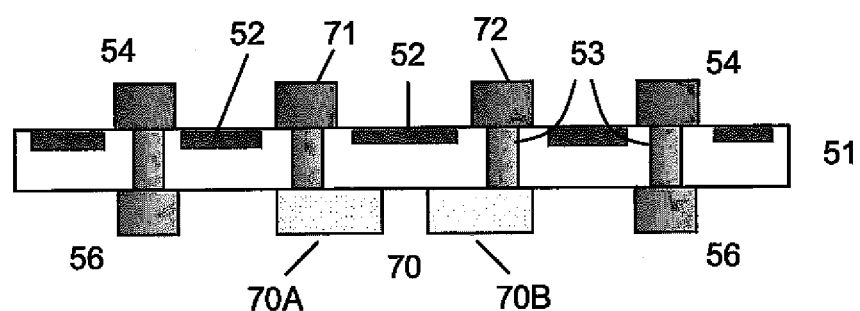
FIGS. 7A, 7B, 8A, 8B, 8C, 9A, 9B, 9C and 9D variously illustrate the implementation of a large component on one or more semiconductor devices within a stacked semiconductor apparatus according to an embodiment of the invention.
Figure 7B:
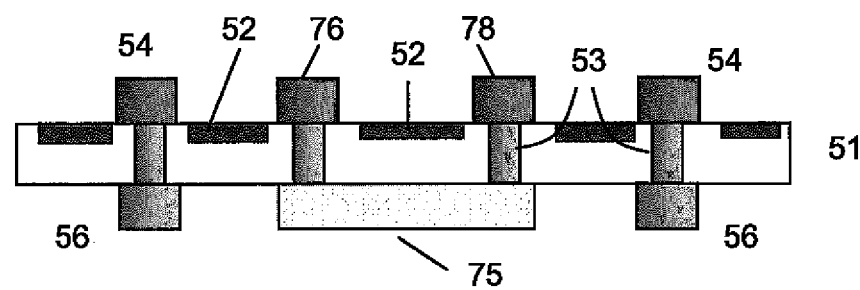

Consider the examples shown in FIG. 7, collectively FIGS. 7A and 7B. In FIG. 7A, a substrate 51 comprises circuit elements 52, front-side inter-device connection elements 54, 71 and 72, TSVs 53, back-side inter-device connection elements 56, and first and second capacitive elements 70A and 70B. In this example, inter-device connection elements 54 and 56 as a corresponding TSV 53 are assumed to form a parallel signal path traversing a stacked plurality of similar devices having the same connection pattern. Additionally, a large capacitive component 70, formed by first and second capacitive elements 70A and 70B may be associated with one or more of the circuit elements 52 on one or more of the substrates 51 (e.g., a die or packaged device) forming the stacked semiconductor apparatus. Alternately, large capacitive component 70 may be associated with a particular signal (e.g., a power/ground signal or C/A/D signal) communicated to one or more circuit elements 52 on one or more of the substrates 51 in the stacked semiconductor apparatus.

Given the available surface area constraints implicit in the arrangement of elements occupying the front-side of substrate 51, large capacitive component 70 would conventionally be exported to the mounting substrate (e.g., a PCB) associated with a stacked plurality of devices. However, embodiments of the invention are able to incorporate large capacitive component 70 on the backside of substrate 51 using an internal connection path formed by TSVs 53 and inter-device connection elements 71 and 72. In this regard, the connection path to large capacitive component 70 may be substrate specific to only substrate 51 (i.e., operatively connected to only circuit elements disposed on substrate 51), or large capacitive component 71 may be connected to one or more circuit elements in a plurality of stacked substrates, including substrate 51, using a parallel and/or a serial connection path formed in accordance with an embodiment of the invention.

The arrangement of elements shown in FIG. 7B is similar to that of FIG. 7A, except a large resistive or inductive component 75 is connected along a connection path between inter-device connection element 76 and inter-device connection element 78.

Figure 8A:
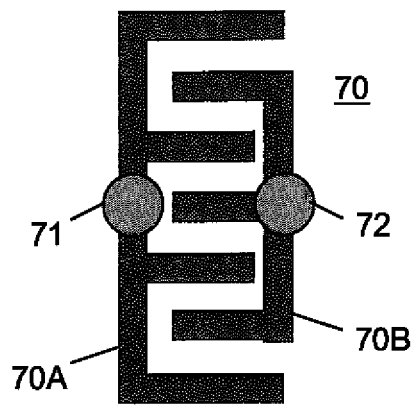
Figure 8B:
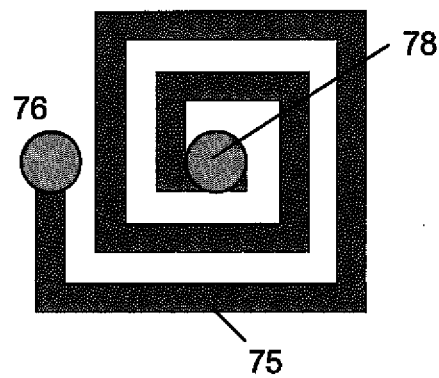
Figure 8C:
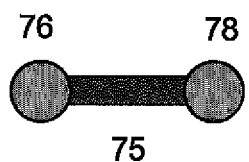

FIG. 8A illustrates one possible embodiment of a large capacitive component 70 (separated charge surfaces 70a and 70B) connected between first inter-device connection element 71 and second inter-device connection element 72 using corresponding TSVs 53. FIG. 8B illustrates one possible embodiment of a large inductive component 75 connected between first inter-device connection element 76 and second inter-device connection element 78 using corresponding TSVs 53, and FIG. 8C illustrates one possible embodiment of a large resistive component 75 connected between first inter-device connection element 76 and second inter-device connection element 78 using corresponding TSVs 53.

In the foregoing embodiments, the necessary use of vertical connection elements (e.g., TSVs) to connect a large component disposed on the back-side of substrate 51 is often facilitated by the preparation of substrate 51 using conventionally understood substrate thinning techniques. By thinning substrate 51 before the back-side connection of a large component, the height profile of a stacked semiconductor apparatus comprising substrate 51 may be reduced. Thus, certain embodiments of the invention are characterized by back-side substrate thinning and back-side fabrication processes in relation to vertical connection elements in order to effectively incorporate a large component on a back-side of the substrate.

The term "large component" is defined as a capacitive, resistive, and/or inductive component having an "as-integrated" size that is at least an order of magnitude greater than the size of capacitive, resistive and/or inductive components forming the front-side circuit elements.

Figure 9B:
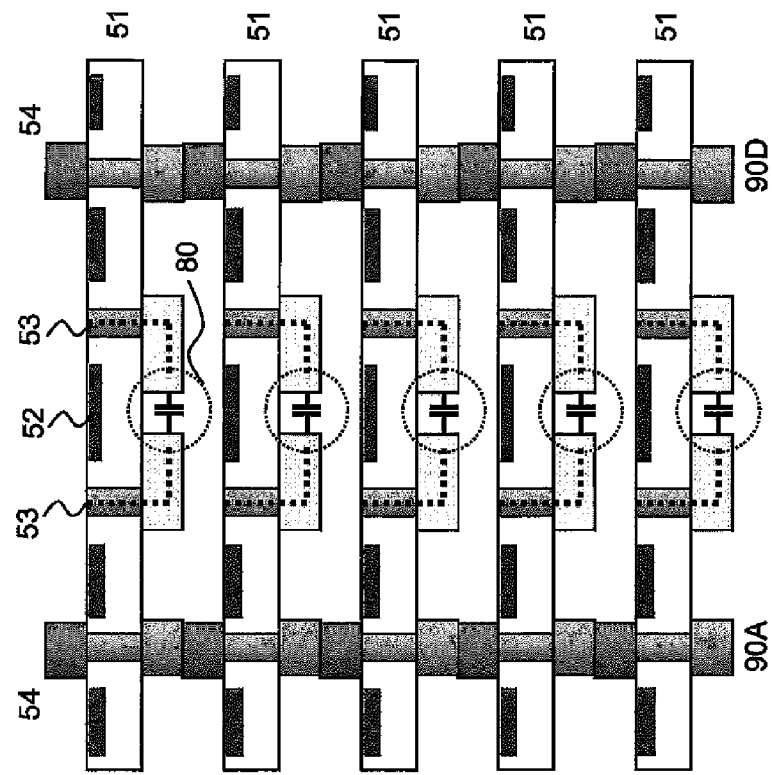
Figure 9A:
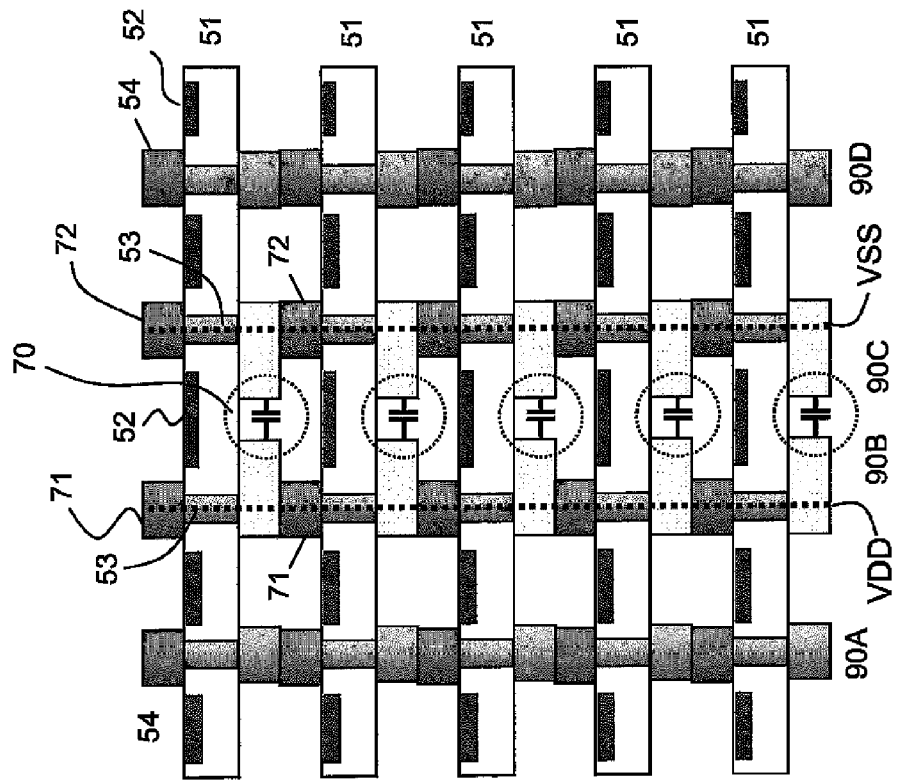

Embodiments shown in FIG. 9, collectively FIGS. 9A-9D extends the foregoing teachings. In FIG. 9A, an example is illustrated wherein a plurality of substrates 51 implementing respective semiconductor devices are stacked connected and receive common signaling through a plurality of parallel, internal connection paths 90A-90D. Parallel connection paths 90B and 90C are used to respectively communicate power signals VDD and VSS to each device in the stacked plurality of devices. However, each device also includes a back-side mounted de-coupling capacitor 70 (one type of large capacitive component) connected between VDD and VSS. This arrangement provides an "on-chip" power de-coupling function that reduces high frequency noise commonly apparent on power signals. In the embodiment of FIG. 9A, each device in the stacked plurality of devices is similarly configured with a back-side mounted de-coupling capacitor 70. However, this need not be the case, and fewer than every one of the devices in the stacked plurality of devices may include a large de-coupling capacitor associated with a commonly provided power signal.

In contrast to the "stack global", power signal conditioning capacitors shown in FIG. 9A, the individual devices of the stacked plurality of devices shown in the embodiment of FIG. 9B include a substrate-specific large capacitive component 80. That is, large capacitive component 80 (e.g., a metal capacitor like a MIM capacitor) is connected to one or more circuit elements 52 disposed on only the constituent substrate 51 using vertical connection elements 53.

Figure 9D:
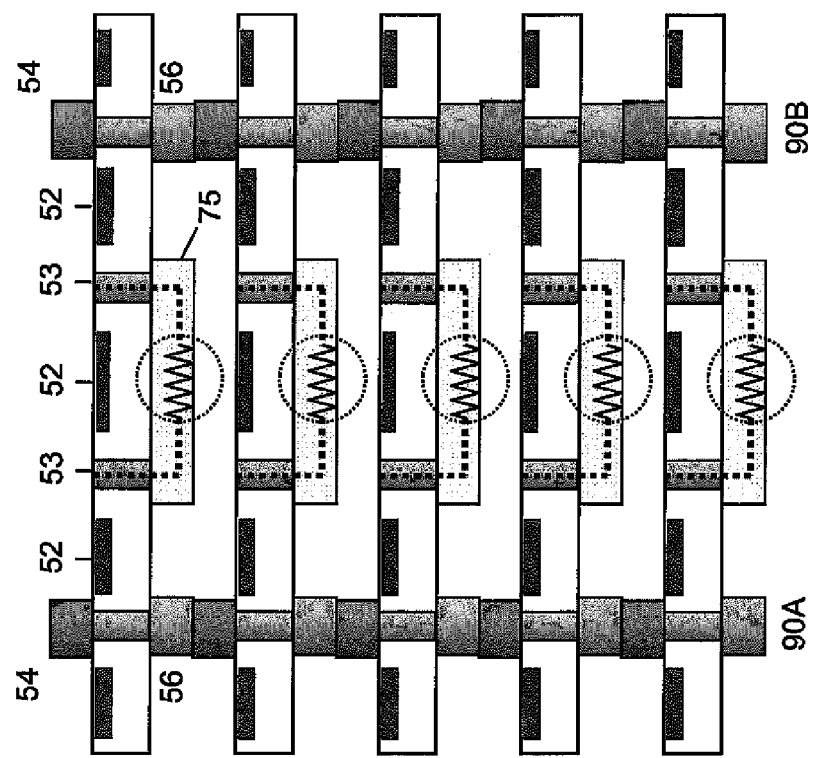
Figure 9C:
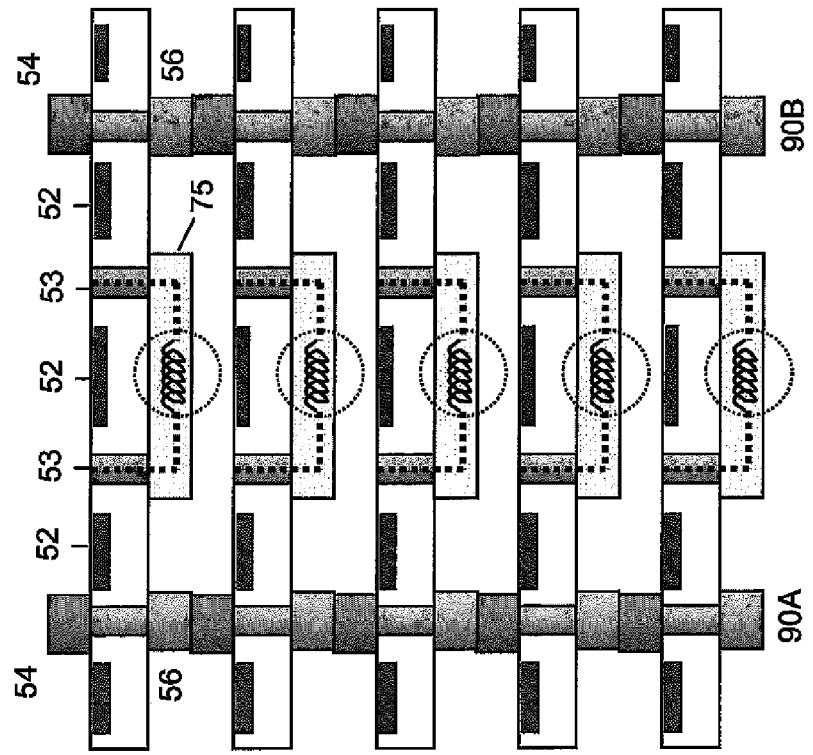

In a similar vein, substrate specific, large inductive components 75 are shown connected in the embodiments illustrated in FIGS. 9C and 9D. The back-side mounted large inductive component 75 allows adequate shielding to be implemented without necessarily expanding the vertical profile of the overall stacked semiconductor apparatus. The back-side mounted large resistive component 75 may be economically implemented using a simple, back-side metallization process.

In yet another embodiment of the invention, internal connection paths may be opportunistically used as vertical thermal conduits through a stacked semiconductor apparatus. The dissipation of thermal energy generated by the operation of circuit elements in a stacked semiconductor apparatus is a serious design consideration. Left unaddressed, excessive thermal energy will damage the circuit elements in a semiconductor device or impair their performance. Certain configurations and uses of internal connection paths within a stacked semiconductor apparatus in relation to a cooling solution are known in the art. See, for example, published U.S. Patent Application No. 2007/0085198, the subject matter of which is hereby incorporated by reference.

However, conventional cooling solutions often require the incorporation of a specialized heat dissipating substrate or a cooling cavity substrate within the stack of semiconductor devices. This requirement complicates the fabrication and increases the height of the resulting stacked semiconductor apparatus.

Rather than incorporating a special heat dissipating substrate or cooling cavity, certain embodiments of the invention provide one or more internal connection paths that operate as vertical thermal conduits. The design precepts previously described may be applied to the formation of vertical thermal conduits through stacked semiconductor apparatuses. Namely, the individual devices forming a stacked semiconductor apparatus may be fabricated with a similar pattern of connection elements including vertical connection elements (e.g., TSVs) and related inter-device connection elements, including at least one back-side interconnection element. Thereafter, a plurality of semiconductor devices may be stack mounted such that corresponding (i.e., vertically aligned within the stack) connection elements form one or more thermal conduits. The embodiment shown in FIG. 10 further illustrates these points.

Figure 10:
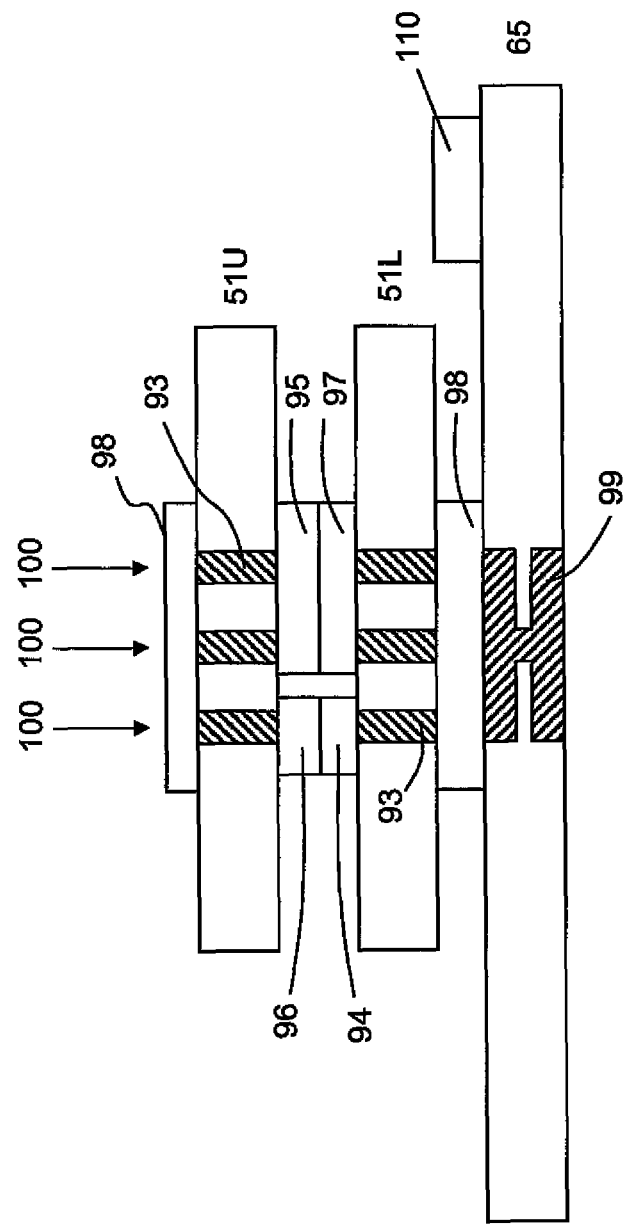
FIGS. 10 and 11 illustrate the implementation of a vertical thermal conduit and/or thermal bus through a stacked semiconductor apparatus according to an embodiment of the invention.

In FIG. 10, lower and upper substrates 51L and 51U are stack mounted on PCB 65. PCB 65 includes a heat sink element 99. Heat sink element 99 may be variously configured on the front-side, back-side, and/or within the body of PCB 65. Conventionally understood metallization processes may be used to thermally couple one or more of vertical thermal conduits 100 to circuit elements disposed on the lower and upper substrates 51L and 51U, and/or to fabricate heat sink element 99. Heat sink element 99 may be a discreet component attached to, or integrally fabricated within PCB 65. Heat sink 99 may be a passive radiative component, or an active component implemented with an associated cooling mechanism, such as a fan or fluid circulating pump.

In the illustrated example of FIG. 10, each vertical thermal conduit 100 is configured from a stack aligned collection of vertical connection elements 93 and an associated collection of inter-device connection elements. However, instead of conducting electrical signals through the stacked semiconductor apparatus like the previously described internal connection paths, vertical thermal conduits 100 are designed to conduct thermal energy away from the circuit elements of lower and upper substrates 51 and towards heat sink element 99. Thus, from a signal provision point of view, vertical thermal conduits 100 may be considered dummy, internal connection paths. Given their disparate purposes, the vertical (thermal) connection elements 93 and vertical (electrical) connection elements 53 of FIG. 5, for example, may be formed from different materials. Alternately, similar material(s) may be used to simultaneously form both types of vertical connection element types during fabrication of the constituent semiconductor devices.

Respective collections of (thermal) vertical connection elements 93 which are vertically aligned through the stacked semiconductor apparatus as a result of the similar connection pattern incorporate into each device, may be variously associated with (thermal) inter-device connection elements (e.g., elements 94-98). Such elements may take various forms and several are illustrated in FIG. 10. For example, inter-device connection elements 96 and 94 are specifically associated as back-side mounted and front-side mounted inter-device interconnection elements with a single vertical thermal conduit 100. That is, similar to the provision of the (electrical) inter-device connection elements in the foregoing embodiments, (thermal) inter-device connection elements, including front-side inter-device connection elements and/or back-side inter-device connection elements may be used to implement a single vertical thermal conduit 100 extending between lower substrate 51L and upper substrate 51U.

Alternately, a plurality of vertical thermal conduits may be coupled to a thermal plate element (e.g., elements 95-98) disposed between adjacent semiconductor devices and serving as a (thermal) inter-device connection element. In the embodiment of FIG. 10, a back-side mounted thermal plate element 95 and a front-side mounted thermal element 97 combine to form a heat plate element transferring heat from upper substrate 51U to lower substrate 51L via two (2) vertical thermal conduits. In similar vein, a heat plate element 98 is disposed between lower substrate 51L and heat sink element 99 on PCB 65 to transfer heat from multiple vertical thermal conduits extending through the stacked semiconductor apparatus to reach heat sink element 99.

Figure 11:
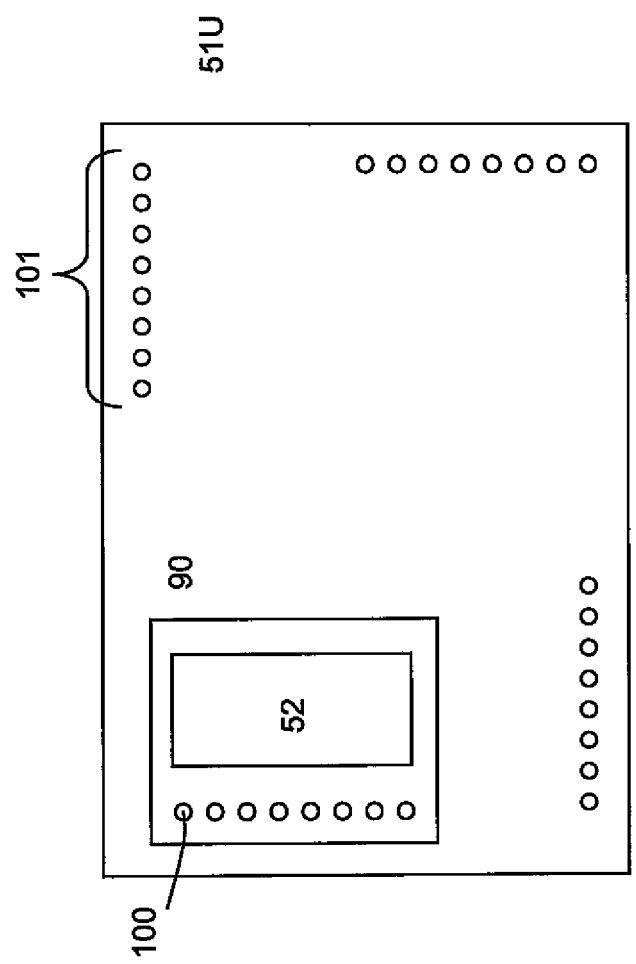

Those skilled in the art will recognize that the heat plates elements connecting vertical thermal conduits through the stacked semiconductor apparatus may also be used to partially dissipate the thermal energy generated by nearby circuit elements. In certain embodiments of the invention like the one illustrated in FIG. 11, multiple vertical thermal conduits are ganged together in a vertical thermal bus 101. While vertical thermal conduits and/or vertical thermal buses may be disposed anywhere within the body of a stacked semiconductor apparatus, certain embodiments of the invention benefit from these components being disposed at the peripheral edge of the stacked semiconductor, since edge located thermal conduits more effectively radiate heat from the stacked devices. As shown in FIG. 11, substrate 51U comprises four (4), edge-located, vertical thermal buses 101 arranged around the periphery of the device. Each vertical thermal conduit 100 in each vertical thermal bus 101 may be thermally coupled to a heat plate element 98 surrounding, wholly or partially, one or more circuit elements 52. In the embodiment of FIG. 11, heat plate element 98 may be readily implemented using a metal layer formed on the font-side of substrate 51U.

Figure 12:
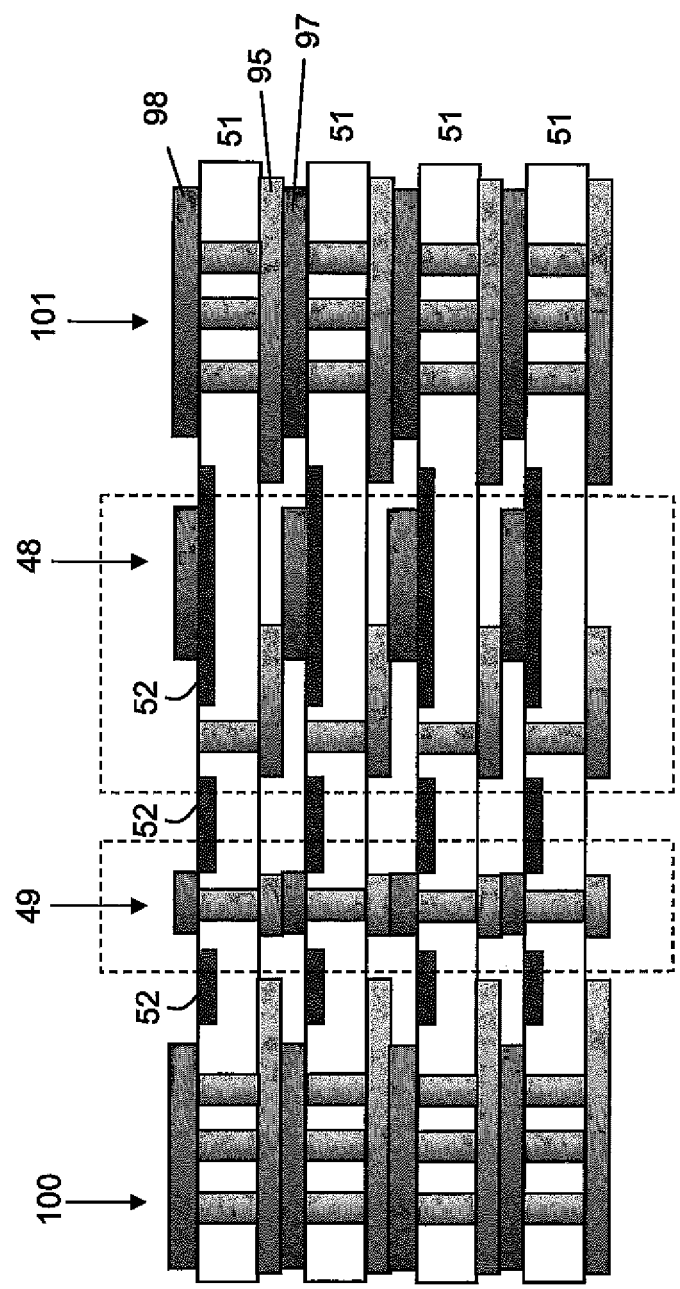
FIG. 12 illustrates an embodiment of the invention incorporating a serial connection path, a parallel connection path, and a vertical thermal conduit through a stacked semiconductor apparatus.

FIG. 12 illustrates how a plurality of semiconductor device 51 may be fabricated with similar connection patterns and thereafter stack mounted one on top of the other, such that vertically aligned connection elements, including vertical connection elements (electrical and thermal) and inter-device connection elements, both front-side and back-side mounted (electrical and thermal), cooperate to form one or more parallel connection paths 49, one or more serial connection paths 48, one or more vertical thermal conduits 100, and/or one or more vertical thermal buses 101 traversing the stacked semiconductor device.

Although not shown in FIG. 12, one or more of the semiconductor devices within the stacked semiconductor apparatus may also incorporate a back-side mounted large component (capacitive. inductive or resistive) consistent with the embodiments shown in FIGS. 7A and 7B.

Considering the embodiments shown in FIGS. 10-12, one may understand the enhanced system or sub-system operating capabilities of a stacked semiconductor apparatus according to an embodiment of the invention. For example, a memory controller 110 disposed on PCB 65 of FIG. 10 is assumed to receive C/A/D signals (e.g., read/write commands with associated data and address information) from an external controller (e.g., a system CPU or host processor). Upon initially receiving the host-generated C/A/D signals (or a corresponding activation command), memory controller 110 enables one or more memory devices in a stacked plurality of memory devices 51 in relation to the received read/write command. Memory device selection or activation may be made using a chip select signal serially communicated through the stacked memory devise 51 via serial connection path 48. Subsequently, address or data associated with read/write command may be communicated via one or more parallel connection path 49. The thermal energy generated by circuit elements in the stacked memory devices 51 may be dissipated via vertical thermal conduits 100 and/or vertical thermal buses 101.

All of these operating capabilities are facilitated by internal connection paths traversing the stacked memory devices. However, provision of one or more serial connection path(s) through the stack does not require constituent devices having different connection elements patterns, as is conventional. Large components and thermal conduits may be provided within the stacked semiconductor devices along with parallel and serial connection paths using back-side fabrication processes in conjunction with semiconductor devices having a similar connection pattern. In this manner, enhanced operating capabilities may be provided in very dense semiconductor packages, single package sub-systems, or single package systems with improved fabrication efficiency and reduced inventory overhead.

While the present invention has been particularly shown and described with reference to exemplary embodiments thereof, it will be understood by those of ordinary skill in the art that various changes in form and details may be made therein without departing from the scope of the invention as defined by the following claims and their equivalents.

What is claimed is:

1. An electronic apparatus, comprising:
   a stacked plurality of semiconductor devices, each device comprising a substrate having a front-side and a back-side, a circuit element disposed on the front-side of the substrate, and electrically conductive connection elements including a first inter-device connection element disposed on the front-side of the substrate, a first back-side connection element disposed on the back-side of the substrate, and a first vertical connection element extending through the substrate, and
   wherein the circuit element disposed on the front-side of the substrate comprises at least one integrated circuit device,
   the circuit elements respectively disposed on the front-sides of upper and lower ones of the stacked plurality of semiconductor devices are electrically connected in series by respective ones of the electrically conductive connection elements comprising the first inter-device connection element disposed on the front-side of the lower device, the first back-side connection element disposed on the back-side of the upper device, and the first vertical connection element extending through the substrate of the upper device, and
   the first inter-device connection element, the first back-side connection element, and the first vertical connection element of each of the semiconductor devices constituting the stacked plurality of semiconductor devices are vertically aligned with the first inter-device connection element, the first back-side connection element, and the first vertical connection element, respectively, of each the other semiconductor devices constituting the stacked plurality of semiconductor devices.

2. The apparatus of claim 1, wherein the first vertical connection element is a through silicon via (TSV).

3. The apparatus of claim 1, wherein the first inter-device connection element is a metal bump.

4. The apparatus of claim 3, wherein the metal bump also physically joins the upper device and the lower device to one another.

5. The apparatus of claim 1, wherein the upper semiconductor device further comprises a distribution line extending along the front-side of the substrate and connecting the circuit element and the first vertical connection element thereof, and the distribution line constitutes the electrically conductive connection elements that connect the circuit elements in series.

6. The apparatus of claim 1, further comprising:
a second inter-device connection element disposed on the front-side of the lower device, a second back-side connection element disposed on the back-side of the upper device, and a second vertical connection element extending through the substrate of the upper device, and
wherein the second inter-device connection element, the second back-side connection element, and the second vertical connection element are vertically aligned in the stacked plurality of semiconductor devices, and
the upper and lower semiconductor devices are electrically connected in parallel by electrically conductive connections comprising the second inter-device connection element, the second back-side connection element, and the second vertical connection element.

7. The apparatus of claim 1, further comprising:
at least one vertical thermal conduit coupling circuit elements disposed on both the upper and lower devices, and comprising:
a third back-side connection element disposed between the upper and lower devices,
a third vertical connection element extending through the substrate of the upper device, and
a fourth vertical connection element extending through the substrate of the lower device, wherein the third and fourth vertical connection elements are vertically aligned in the stacked plurality of semiconductor devices.

8. The apparatus of claim 7, wherein the at least one vertical thermal conduit comprises a plurality of vertical thermal conduits forming a thermal bus, and
the third back-side connection element comprises a heat plate element thermally coupling a plurality of the third vertical connection elements of the upper device with a plurality of the fourth vertical connection elements of the lower device.

9. The apparatus of claim 1, wherein each one of the plurality of semiconductor devices is a semiconductor memory device.

10. The apparatus of claim 9, further comprising a mounting substrate on which the stacked plurality of semiconductor devices are mounted, wherein the mounting substrate comprises a memory controller providing command/address/data (C/A/D) signals associated with read/write operations directed to one or more of the stacked plurality of semiconductor devices.

11. The apparatus of claim 1, wherein the electronic element comprises at least one passive element selected from the group consisting of a resistor, an inductor, and a capacitor, and further comprises at least one internal connection.

* * * * *